(12) United States Patent
Lai et al.

(10) Patent No.: US 11,630,153 B2
(45) Date of Patent: Apr. 18, 2023

(54) CHIP TESTING APPARATUS AND SYSTEM WITH SHARING TEST INTERFACE

(71) Applicant: Winbond Electronics Corp., Taichung (TW)

(72) Inventors: Chih-Chiang Lai, Taichung (TW); Cheng-Ching Huang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 99 days.

(21) Appl. No.: 17/239,688

(22) Filed: Apr. 26, 2021

(65) Prior Publication Data
US 2022/0341991 A1 Oct. 27, 2022

(51) Int. Cl.
*G01R 31/3185* (2006.01)
*G01R 1/067* (2006.01)
*G11C 29/12* (2006.01)

(52) U.S. Cl.
CPC ... *G01R 31/318513* (2013.01); *G01R 1/0675* (2013.01); *G11C 29/12* (2013.01); *G11C 2029/1206* (2013.01)

(58) Field of Classification Search
CPC .......... G01R 31/2831; G01R 31/31712; G01R 31/31715; G01R 31/318505; G01R 31/318511; G01R 31/318513; G01R 1/0675; G06F 11/2273; G06F 11/26; G11C 29/006; G11C 22/22; G11C 2924/00; G11C 2924/0002; G11C 29/12; G11C 2029/1206
See application file for complete search history.

(56) References Cited

U.S. PATENT DOCUMENTS

| | | | | |
|---|---|---|---|---|
| 4,956,602 A | * | 9/1990 | Parrish | G01R 31/2831 257/E21.526 |
| 5,635,846 A | * | 6/1997 | Beaman | H01L 23/49827 324/756.03 |
| 6,360,755 B1 | * | 3/2002 | Schantz | B28D 5/0005 134/22.12 |
| 6,871,307 B2 | * | 3/2005 | Nachumovsky | G11C 29/006 324/750.25 |
| 7,202,692 B2 | * | 4/2007 | Miyano | G01R 31/31723 324/762.01 |
| 7,286,436 B2 | | 10/2007 | Bhakta et al. | |
| 7,746,711 B2 | | 6/2010 | Inaba | |

(Continued)

FOREIGN PATENT DOCUMENTS

CN 110246813 9/2019
TW 514734 12/2002

(Continued)

OTHER PUBLICATIONS

"Office Action of Taiwan Counterpart Application", dated Sep. 30, 2021, p. 1-p. 7.

*Primary Examiner* — Vinh P Nguyen
(74) *Attorney, Agent, or Firm* — JCIPRNET

(57) ABSTRACT

A chip testing apparatus and system suitable for performing testing on multiple chips in a chip cluster are provided. The chip testing apparatus includes a signal interface and a test design circuit. The signal interface transmits an input signal and multiple driving signals in parallel from a test equipment to each of the chips. The test design circuit receives multiple output signals from the chips through the signal interface and serially outputs a test data to the test equipment according to the output signals.

19 Claims, 4 Drawing Sheets

(56) References Cited

U.S. PATENT DOCUMENTS 9,488,674 B2 * 11/2016 Marques Martins ........................ G01R 31/31905
10,636,497 B2    4/2020 Sudo
2003/0041296 A1  2/2003 Bos et al.

FOREIGN PATENT DOCUMENTS

TW         589461    6/2004
TW      201632905    9/2016

* cited by examiner

CHIP TESTING APPARATUS AND SYSTEM WITH SHARING TEST INTERFACE

BACKGROUND

Technical Field

This disclosure relates to a chip testing apparatus and system, and in particular to a chip testing apparatus and system applied to a chip probing (CP) stage.

Description of Related Art

In order to reduce the test costs, most of current memory tests allocate test channels on a test fixture to multiple chips for usage, so as to increase the number of chips in test parallelism to reduce test time. However, in the current practice, at least one probing pin has to be reserved for each chip on the test fixture for connection to an input output pin (TO pin) of the chip, so as to transmit test results of each chip. In addition, the number of probing pins of the test fixture also has to match the number of test pins of the chips in test parallelism, which limits possible increment in the number of chips in test parallelism and therefore prevents further reduction in the test costs.

SUMMARY

This disclosure provides a chip testing apparatus and system, which increase the number of chips in test parallelism by sharing a test interface.

The chip testing apparatus of the disclosure is suitable for testing multiple chips in a chip cluster. The chip testing apparatus includes a signal interface and a test design circuit. The signal interface couples to the chips in the chip cluster. The signal interface transmits an input signal and multiple driving signals in parallel from a test equipment to each chip. The test design circuit is coupled to the signal interface. The test design circuit receives multiple output signals from the chips through the signal interface and serially outputs test data to the test equipment according to the output signals.

The testing apparatus system of the disclosure includes a chip cluster with multiple chips, a test equipment, and the above chip testing apparatus. The chip testing apparatus is coupled to the chips in the chip cluster and the test equipment. The chip testing apparatus performs testing on the chips in the chip cluster.

Based on the above, the chip testing apparatus and system of the disclosure can not only enable the driving pins of each chip to be tested to share the same driving pad, but also enable the input output pins of each chip to be tested to share the same input output pad. Therefore, the chip testing apparatus and system of the disclosure do not have to reserve a probing pin for the input output pin of each chip for testing and the number of the chips in test parallelism is not limited to the number of probing pins of the test fixture, thereby easily increasing the number of chips in test parallelism, which reduces the test costs of the memory chips.

To make the abovementioned more comprehensible, several embodiments accompanied by drawings are described in detail as follows.

DESCRIPTION OF THE EMBODIMENTS

Figure 1:
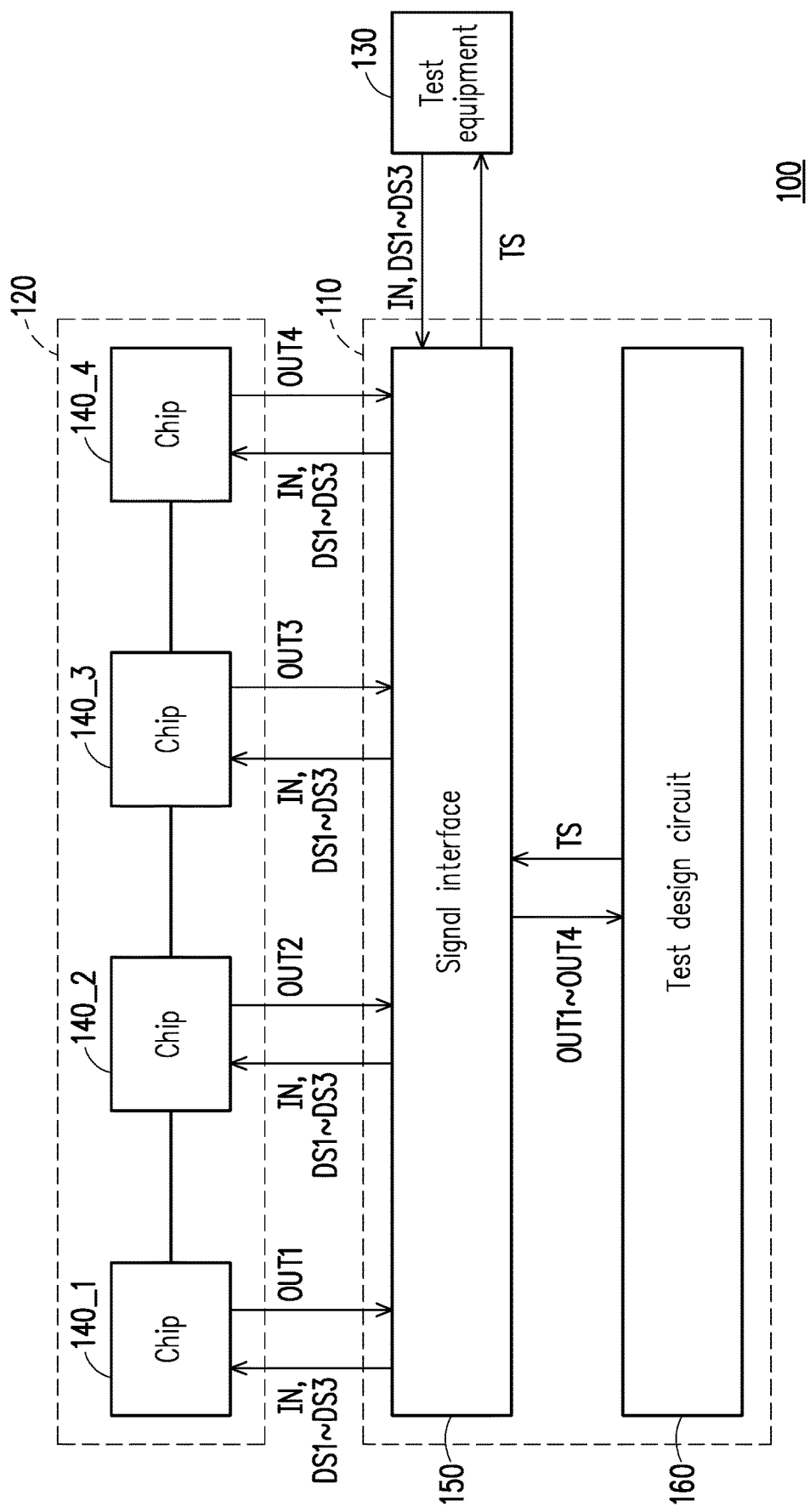
FIG. 1 is a schematic diagram of a chip testing system according to an embodiment of the disclosure.

Firstly, with reference to FIG. 1, FIG. 1 is a schematic diagram of a chip testing system according to an embodiment of the disclosure. In the embodiment, a chip testing system 100 includes a chip testing apparatus 110, a chip cluster 120, and a test equipment 130. The chip cluster 120 includes four chips 140_1 to 140_4. For example, the chip cluster 120 may be formed by selecting the four chips 140_1 to 140_4 with positions in close proximity to each other on the wafer to be tested. Those skilled in the art may determine the number of the chips in the chip cluster 120 according to their actual needs and the embodiment of the disclosure is not limited thereto. The test equipment 130 includes, for example, a test fixture such as a probe card, which can be used in a chip probing (CP) stage to determine whether a chip is good or bad.

The chip testing apparatus 110 may be suitable for testing the four chips 140_1 to 140_4 in the chip cluster 120. The chip testing apparatus 110 includes a signal interface 150 and a test design circuit 160. As shown in FIG. 1, the signal interface 150 is coupled to the chips 140_1 to 140_4 in the chip cluster 120. The signal interface 150 may transmit an input signal IN and three driving signals DS1 to DS3 in parallel from the test equipment 130 to each of the chips 140_1 to 140_4 when testing is performed on the chips 140_1 to 140_4. The input signal IN, for example, carries data for testing. The driving signals DS1 to DS3 include, for example, a clock signal, an address signal, a chip control signal, and so on.

The test design circuit 160 is coupled to the signal interface 150. As shown in FIG. 1, the test design circuit 160 may receive 4 output signals OUT1 to OUT4 from the chips 140_1 to 140_4 through the signal interface 150 when testing is performed on the chips 140_1 to 140_4. In addition, the test design circuit 160 may serially output test data TS to the test equipment 130 via the signal interface 150 according to the output signals OUT1 to OUT4. In this way, the test equipment 130 may determine whether the chips 140_1 to 140_4 are good or bad according to the test data TS.

It should be noted that, because the signal interface 150 in this case is formed from wiring and buffers only, a logic level of and a value indicated by the signal is unchanged, therefore the same reference numerals are used in FIG. 1 to indicate the signals (the input signal IN, the driving signals DS1 to DS3, the output signals OUT1 to OUT4, and the test data TS) transmitted via the signal interface 150. Reference may be made to subsequent description for a detailed circuit structure of the signal interface 150.

Figure 2:
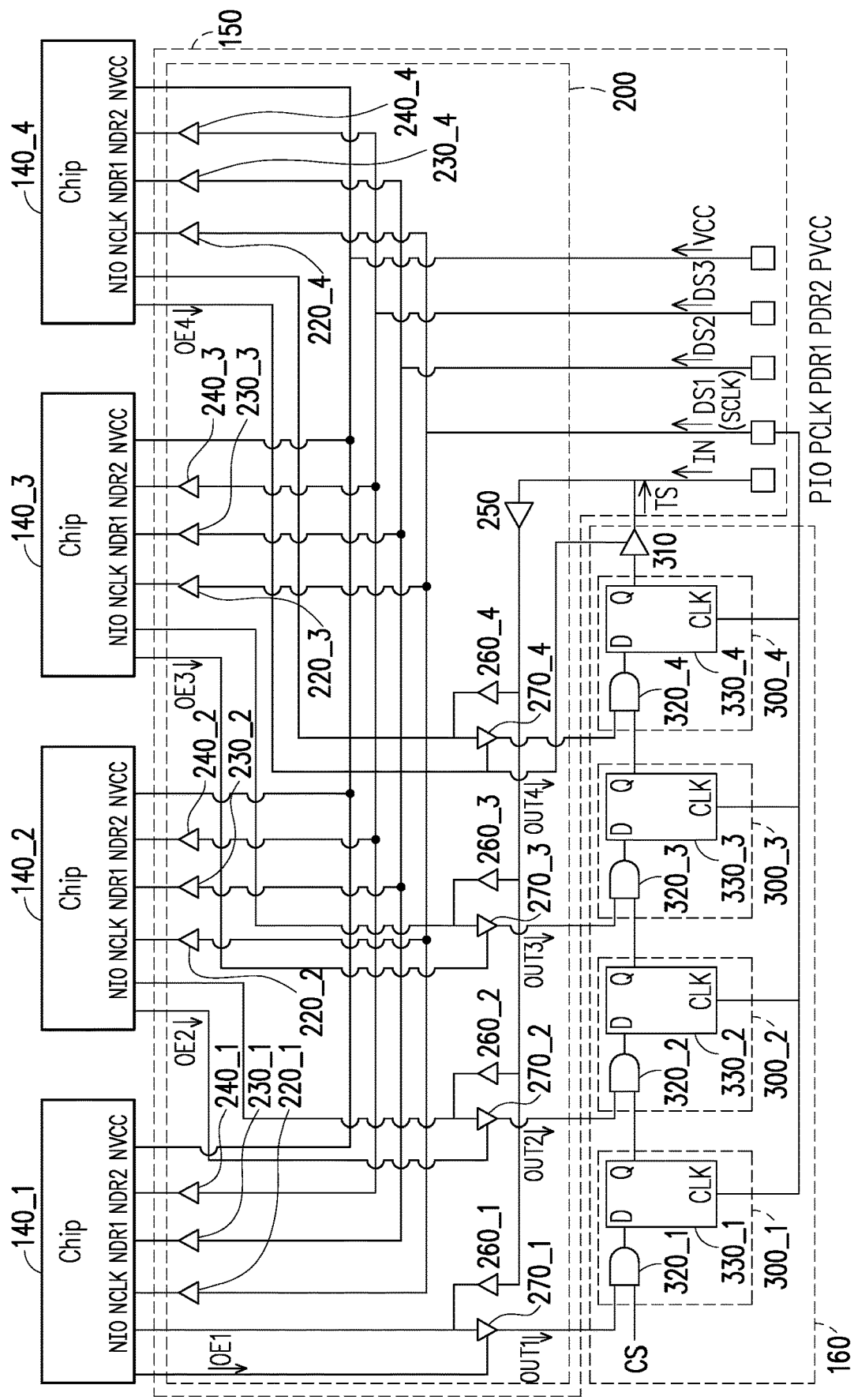
FIG. 2 is a schematic circuit diagram of the chip testing apparatus according to an embodiment of the disclosure.

A detailed circuit structure of the chip testing apparatus 110 of this embodiment is introduced below. FIG. 2 is a schematic circuit diagram of the chip testing apparatus according to an embodiment of the disclosure. In FIG. 2, the signal interface 150 includes a buffer circuit 200, driving pads PCLK, PDR1, and PDR2, an input output pad PIO, and an operating voltage pad PVCC. The buffer circuit 200 is coupled to each of the chips 140_1 to 140_4 and the test design circuit 160. The buffer circuit 200 includes driving buffers 220_1 to 220_4, 230_1 to 230_4, and 240_1 to 240_4, a first input buffer 250, second input buffers 260_1 to 260_4, and output buffers 270_1 to 270_4.

The driving pads PCLK, PDR1, and PDR2 are coupled to the buffer circuit 200. In detail, the driving buffers 220_1, 230_1 and 240_1 in the buffer circuit 200 are coupled to the chip 140_1. The driving buffers 220_2, 230_2 and 240_2 in the buffer circuit 200 are coupled to the chip 140_2. The driving buffers 220_3, 230_3 and 240_3 in the buffer circuit 200 are coupled to the chip 140_3. The driving buffers 220_4, 230_4 and 240_4 in the buffer circuit 200 are coupled to the chip 140_4. An input terminal of each of the driving buffers 220_1 to 220_4 is coupled to the driving pad PCLK. An output terminal of each of the driving buffer 220_1 to 220_4 is coupled to a driving pin NCLK on a corresponding chip. An input terminal of each of the driving buffers 230_1 to 230_4 is coupled to the driving pad PDR1. An output terminal of each of the driving buffers 230_1 to 230_4 is coupled to a driving pin NDR1 on a corresponding chip. An input terminal of each of the driving buffers 240_1 to 240_4 is coupled to the driving pad PDR2. An output terminal of each of the driving buffers 240_1 to 240_4 is coupled to a driving pin NDR2 on a corresponding chip. The driving pads PCLK, PDR1, and PDR2 may respectively receive the driving signals DS1 to DS3 from the test equipment 130 and transmit the driving signals DS1 to DS3 to the driving pins NCLK, NDR1 and NDR2 of each of the chips 140_1 to 140_4 via the buffer circuit 200.

The input output pad PIO is coupled to the test design circuit 160 and the buffer circuit 200. In detail, an input terminal of the first input buffer 250 in the buffer circuit 200 is coupled to the input output pad PIO. The second input buffers 260_1 to 260_4 in the buffer circuit 200 are respectively coupled to the chips 140_1 to 140_4. An input terminal of each of the second input buffers 260_1 to 260_4 is coupled to an output terminal of the first input buffer 250. An output terminal of each of the second input buffers 260_1 to 260_4 is coupled to an input output pin NIO on a corresponding chip. The input output pad PIO may receive the input signal IN from the test equipment 130 and transmit the input signal IN to the input output pin NIO of each of the chips 140_1 to 140_4 via the buffer circuit 200.

The operating voltage pad PVCC is coupled to the buffer circuit 200. The operating voltage pad PVCC receives an operating voltage VCC and transmits the operating voltage VCC to an operating voltage pin NVCC of each of the chips 140_1 to 140_4 via the buffer circuit 200.

In the buffer circuit 200, an input terminal of each of the output buffers 270_1 to 270_4 is coupled to the input output pin NIO on a corresponding chip. Control terminals of the output buffers 270_1 to 270_4 are respectively coupled to output enable signals OE1 to OE4. An output terminal of each of the output buffers 270_1 to 270_4 is coupled to the test design circuit 160. The buffer circuit 200 may transmit the output signals OUT1 to OUT4 outputted from the chips 140_1 to 140_4 in parallel to the test design circuit 160 in response to the output enable signals OE1 to OE4. For example, the chips 140_1 to 140_4 may also transmit the output enable signals OE1 to OE4 at a high logic level to the output buffers 270_1 to 270_4 when the chips 140_1 to 140_4 are transmitting the output signals OUT1 to OUT4 to the output buffers 270_1 to 270_4. In this way, the output buffers 270_1 to 270_4 may start to transmit the output signals OUT1 to OUT4 in parallel to the test design circuit 160.

The test design circuit 160 includes flip-flop circuits 300_1 to 300_4 and a test buffer 310. The flip-flop circuits 300_1 to 300_4 are connected in series. A first input terminal of each of the flip-flop circuit 300_1 to 300_4 is respectively coupled to the output terminal of the output buffers 270_1 to 270_4 in the buffer circuit 200. A second input terminal of the flip-flop circuit 300_1 at a first level is coupled to a serial control signal CS. Second input terminals of the flip-flop circuits 300_2 to 300_4 other than the flip-flop circuit at the first level are coupled to an output terminal of the flip-flop circuit at the previous level.

An input terminal of the test buffer 310 is coupled to an output terminal of the flip-flop circuit 300_4 at a final level. A control terminal of the test buffer 310 is coupled to the output enable signal OE4. An output terminal of the test buffer 310 is coupled to the input output pad PIO.

In the embodiment, the driving signal DS1 may, for example, be operated as a clock signal SCLK. The test design circuit 160 may serially transmit the output signals OUT1 to OUT4 sequentially serving as the test data TS to the input output pad PIO in response to the clock signal SCLK. In detail, the flip-flop circuits 300_1 to 300_4 at each level in the test design circuit 160 may transmit the received output signals OUT1 to OUT4 to the flip-flop circuit at the next level in response to the clock signal SCLK, after the output signals OUT1 to OUT4 are transmitted in parallel to the test design circuit 160 by the output buffers 270_1 to 270_4, so as to enable the flip-flop circuit 300_4 at the final level to serially output the output signals OUT1 to OUT4 sequentially serving as the test data TS to the input output pad PIO via the test buffer 310.

In a structure of the flip-flop circuit, the flip-flop circuits 300_1 to 300_4 respectively include AND gates 320_1 to 320_4 and flip-flops 330_1 to 330_4. A first input terminal of the AND gate 320_1 is coupled to the output buffer 270_1 in the buffer circuit 200. A second input terminal of the AND gate 320_1 is coupled to the serial control signal CS. An input terminal of the flip-flop 330_1 is coupled to an output terminal of the AND gate 320_1. A control terminal of the flip-flop 330_1 is coupled to the clock signal SCLK. An output terminal of the flip-flop 330_1 is coupled to a second input terminal of the AND gate 320_2 in the flip-flop circuit 330_2 at the next level. A first input terminal of the AND gate 320_2 is coupled to the output buffer 270_2 in the buffer circuit 200. An input terminal of the flip-flop 330_2 is coupled to an output terminal of the AND gate 320_2. A control terminal of the flip-flop 330_2 is coupled to the clock signal SCLK. An output terminal of the flip-flop 330_2 is coupled to a second input terminal of the AND gate 320_3 in the flip-flop circuit 330_3 at the next level. A first input terminal of the AND gate 320_3 is coupled to the output buffer 270_3 in the buffer circuit 200. An input terminal of the flip-flop 330_3 is coupled to an output terminal of the AND gate 320_3. A control terminal of the flip-flop 330_3 is coupled to the clock signal SCLK. An output terminal of the flip-flop 330_3 is coupled to a second input terminal of the AND gate 320_4 in the flip-flop circuit 330_4 at the next level. A first input terminal of the AND gate 320_4 is coupled to the output buffer 270_4 in the buffer circuit 200. An input terminal of the flip-flop 330_4 is coupled to an output terminal of the AND gate 320_4. A control terminal of the flip-flop 330_4 is coupled to the clock signal SCLK. An output terminal of the flip-flop 330_4 is coupled to the input terminal of the test buffer 310.

It should be noted that those skilled in the art may refer to the teachings of the embodiments of the disclosure according to their actual needs and increase by analogy the number of the buffers and the number of the flip-flop circuits connected in series in the buffer circuit 200, and the embodiment of the disclosure is not limited thereto.

Figure 3:
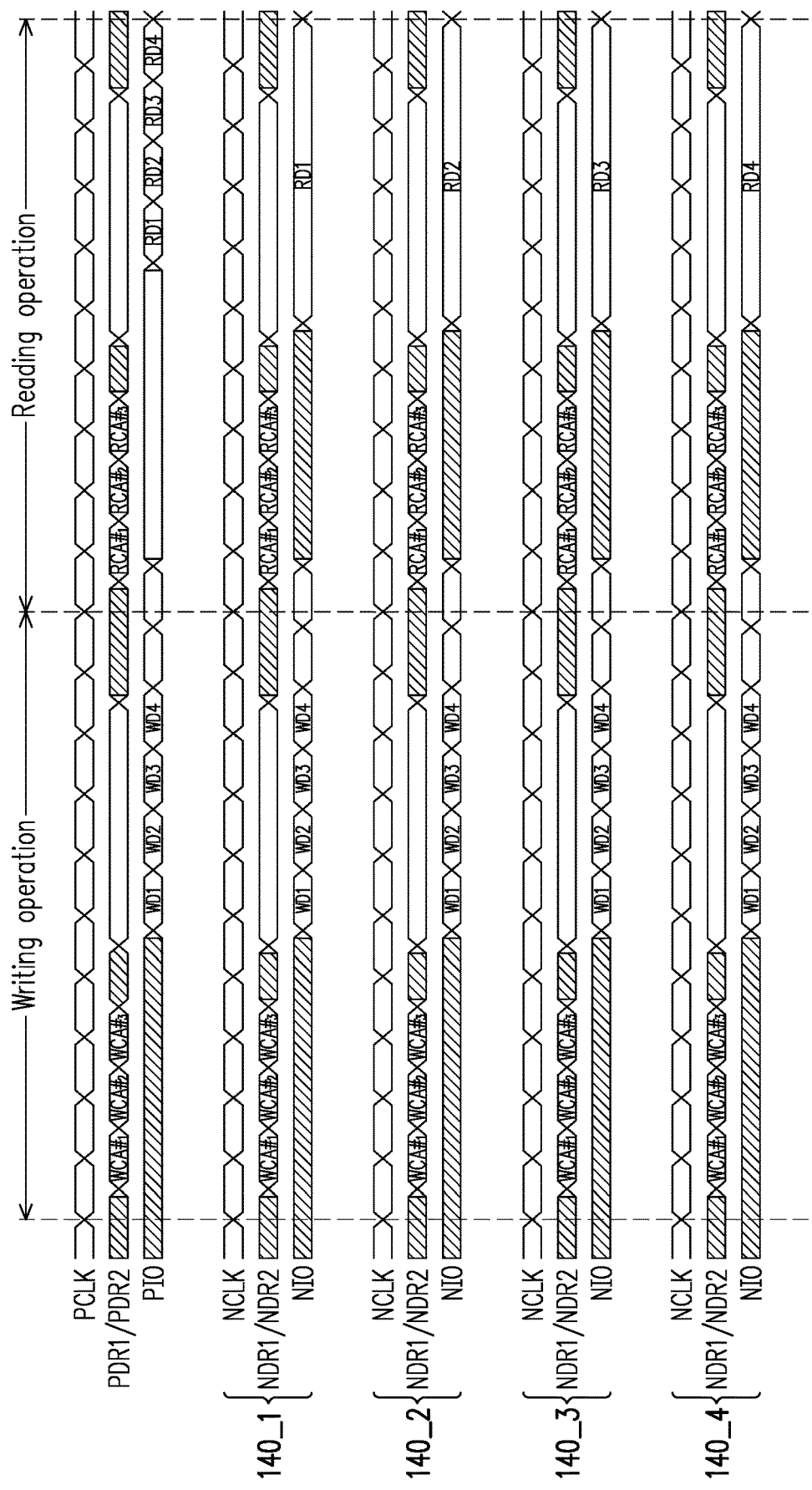
FIG. 3 is a schematic diagram of signals of the chip testing apparatus according to an embodiment of the disclosure.

FIG. 3 is a schematic diagram of signals of the chip testing apparatus according to an embodiment of the disclosure. FIG. 3 shows the signals on the driving pads PCLK, PDR1, and PDR2, the input output pad PIO, the driving pins NCLK, NDR1, and NDR2, and the input output pin NIO of each of the chips 140_1 to 140_4. Reference may be made to FIGS. 2 and 3.

A writing operation and a reading operation may be performed on the chips 140_1 to 140_4 when testing is performed on the chips 140_1 to 140_4. The driving pads PDR1 and PDR2 may receive write commands WCA #1, WCA #2, and WCA #3 from the test equipment 130 through the driving signals DS2 and DS3 when the writing operation is being performed. At this time, as shown in FIG. 3, the write commands WCA #1, WCA #2, and WCA #3 may be transmitted to the driving pins NDR1 and NDR2 of each of the chips 140_1 to 140_4 via the buffer circuit 200.

Then, the input output pad PIO may receive written data WD1 to WD4 from the test equipment 130 through the input signal IN. At this time, as shown in FIG. 3, the written data WD1 to WD4 may be transmitted to the input output pin NIO of each of the chips 140_1 to 140_4 via the buffer circuit 200.

The driving pads PDR1 and PDR2 may receive read commands RCA #1, RCA #2, and RCA #3 from the test equipment 130 through the driving signals DS2 and DS3 when the reading operation is being performed. At this time, as shown in FIG. 3, the read commands RCA #1, RCA #2, and RCA #3 may be transmitted to the driving pins NDR1 and NDR2 of each of the chips 140_1 to 140_4 via the buffer circuit 200.

Then, the input output pin MO of each of the chips 140_1 to 140_4 may respectively generate read data RD1 to RD4 according to the read commands RCA #1, RCA #2, and RCA #3. At this time, the read data RD1 to RD4 may be transmitted in parallel to the test design circuit 160 via the buffer circuit 200. Moreover, as shown in FIG. 3, the test design circuit 160 may sequentially transmit the read data RD1 to RD4 in series to the input output pad PIO in response to the clock signal on the driving pad PCLK.

According to the operation mode described above, the chip testing apparatus 110 of the embodiment may enable the chips 140_1 to 140_4 to share the same driving pads PCLK, PDR1, and PDR2, the input output pad PIO, and the operating voltage pad PVCC, and perform testing on more chips without increasing the test time through the signal interface 150 and configuration of the test design circuit 160.

Figure 4:
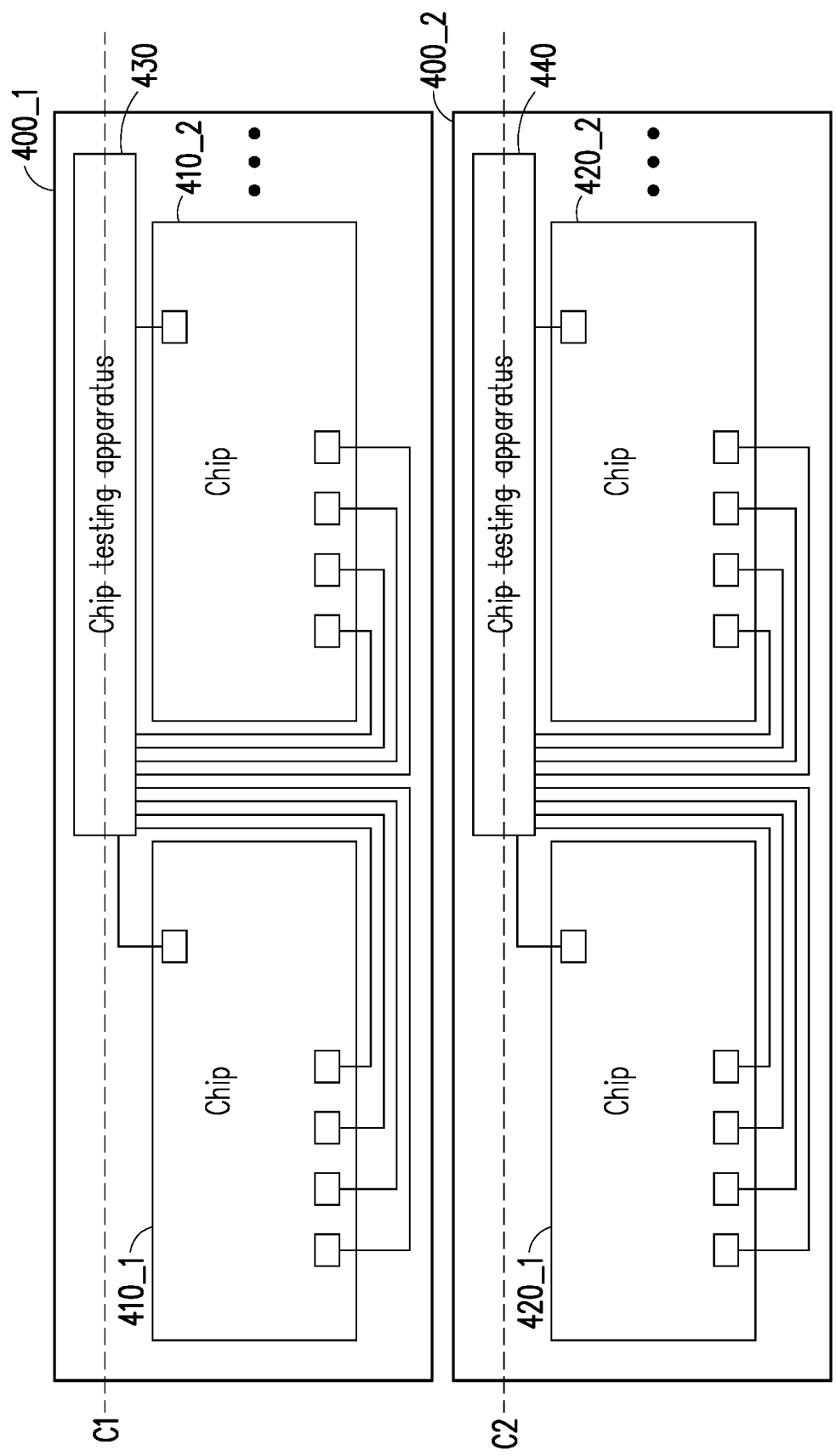
FIG. 4 is a configuration example of the chip testing apparatus according to an embodiment of the disclosure.

FIG. 4 is a configuration example of the chip testing apparatus according to an embodiment of the disclosure. FIG. 4 shows chip clusters 400_1 and 400_2 on a wafer. The chip cluster 400_1 includes multiple chips such as chips 410_1 to 410_2. The chip cluster 400_2 includes multiple chips such as chip 420_1 to 420_2. A chip testing apparatus 430 may be disposed on a cutting lane C1 on the wafer to which the chip cluster 400_1 belongs and a chip testing apparatus 440 may be disposed on a cutting lane C2 on the wafer to which the chip cluster 400_2 belongs. Since there is no circuit configured on the cutting lanes C1 and C2 of the wafer, disposing the chip testing apparatuses 430 and 440 applied to a chip probing stage on the cutting lanes C1 and C2 removes the need to increase the chip size and prevent interference with other wirings. However, in other embodiments, the chip testing apparatuses 430 and 440 may also be respectively disposed within the chips of the chip clusters 400_1 and 400_2, and the embodiment of the disclosure is not limited thereto.

In summary, the chip testing apparatus and system of the disclosure may serially transmit the output signals outputted in parallel from the multiple chips to the shared input output pad in the chip cluster, therefore easily increasing the number of the chips in test parallelism without increasing the test time, which reduces the test costs of the memory chips.

Although the disclosure has been disclosed with the foregoing exemplary embodiments, they are not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A chip testing apparatus, suitable for testing a plurality of chips in a chip cluster, the chip testing apparatus comprising:
a signal interface, coupled to the plurality of chips in the chip cluster, wherein the signal interface transmits an input signal and a plurality of driving signals in parallel from a test equipment to each of the chips; and
a test design circuit, coupled to the signal interface, wherein the test design circuit receives a plurality of output signals from the plurality of chips through the signal interface and serially outputs a test data to the test equipment according to the plurality of output signals, wherein the test design circuit serially transmits the plurality of output signals sequentially serving as the test data to the test equipment through the signal interface.

2. The chip testing apparatus according to claim 1, wherein the signal interface comprises:
a buffer circuit, coupled to each of the chip and the test design circuit;
a plurality of driving pads, coupled to the buffer circuit, wherein the plurality of driving pads receive the plurality of driving signals from the test equipment and transmit the plurality of driving signals to each of the chips via the buffer circuit; and
an input output pad, coupled to the test design circuit and the buffer circuit, wherein the input output pad receives the input signal from the test equipment and transmits the input signal to each of the chips via the buffer circuit.

3. The chip testing apparatus according to claim 2, wherein the buffer circuit transmits the plurality of output signals outputted from the plurality of chips in parallel to the test design circuit in response to a plurality of output enable signals and the test design circuit serially transmits the plurality of output signals sequentially serving as the test data to the input output pad in response to a clock signal in the driving signals.

4. The chip testing apparatus according to claim 2, wherein the buffer circuit comprises:
a plurality of driving buffers, wherein an input terminal of each of the driving buffers is coupled to a corresponding driving pad and an output terminal of each of the driving buffers is coupled to a driving pin on a corresponding chip;
a first input buffer, wherein an input terminal of the first input buffer is coupled to the input output pad,
a plurality of second input buffers, wherein an input terminal of each of the second input buffers is coupled to an output terminal of the first input buffer and an output terminal of each of the second input buffers is coupled to an input output pin on a corresponding chip; and a plurality of output buffers, wherein an input terminal of each of the output buffers is coupled to the input output pin on the corresponding chip, a control terminal of each of the output buffers is coupled to a corresponding output enable signal, and an output terminal of each of the output buffers is coupled to the test design circuit.

5. The chip testing apparatus according to claim 2, wherein the test design circuit comprises:

a plurality of flip-flop circuits connected in series, wherein a first input terminal of each of the flip-flop circuits is coupled to the buffer circuit, a second input terminal of a first level flip-flop circuit is coupled to a serial control signal, and second input terminals of the flip-flop circuits other than the flip-flop circuit at the first level is coupled to an output terminal of the flip-flop circuit at a previous level; and a test buffer, wherein an input terminal of the test buffer is coupled to an output terminal of a final level flip-flop circuit, a control terminal of the test buffer is coupled to a corresponding output enable signal, and an output terminal of the test buffer is coupled to the input output pad, wherein the flip-flop circuit at each of the levels transmits received output signals to the flip-flop circuit at a next level in response to the clock signal, so as to enable the final level flip-flop circuit to serially transmit the plurality of output signals sequentially serving at the test data through the test buffer.

6. The chip testing apparatus according to claim 5, wherein each of the flip-flop circuits comprises:

a AND gate, wherein a first input terminal of the AND gate is coupled to the buffer circuit; and a flip-flop, wherein an input terminal of the flip-flop is coupled to an output terminal of the AND gate, a control terminal of the flip-flop is coupled to the clock signal, and an output terminal of the flip-flop is coupled to a second input terminal of the AND gate in the next level the flip-flop circuit, wherein a second input terminal of the AND gate in the first level flip-flop circuit is coupled to the serial control signal and an output terminal of the flip-flop in the final level flip-flop circuit is coupled to an input terminal of the test buffer.

7. The chip testing apparatus according to claim 2, wherein the signal interface further comprises:

an operating voltage pad, coupled to the buffer circuit, wherein the operating voltage pad receives an operating voltage and transmits the operating voltage to each of the chips via the buffer circuit.

8. The chip testing apparatus according to claim 1, wherein the chip testing apparatus is disposed on a cutting lane on a wafer to which the chip cluster belongs.

9. The chip testing apparatus according to claim 1, wherein the chip testing apparatus is disposed within the chip cluster.

10. A chip testing system, comprising:

a chip cluster, having a plurality of chips;

a test equipment; and the chip testing apparatus according to claim 1, coupled to the chip cluster and the test equipment, wherein the chip testing apparatus performs testing on the plurality of chips in the chip cluster.

11. The chip testing system according to claim 10, wherein when testing is being performed on the chips, the signal interface is configured to transmit the input signal and the driving signals in parallel from the test equipment to each of the chips and the test design circuit is configured to receive the plurality of output signals from the plurality of chips through the signal interface and serially output the test data to the test equipment through the signal interface according to the plurality of output signals.

12. A chip testing system, suitable for testing a plurality of chips in a chip cluster, the chip testing apparatus comprising:

a signal interface, coupled to the plurality of chips in the chip cluster, wherein the signal interface transmits an input signal and a plurality of driving signals in parallel from a test equipment to each of the chips; and a test design circuit, coupled to the signal interface, wherein the test design circuit receives a plurality of output signals from the plurality of chips through the signal interface and serially outputs a test data to the test equipment according to the plurality of output signals, wherein the signal interface comprises a buffer circuit, coupled to each of the chip and the test design circuit, wherein the buffer circuit transmits the plurality of output signals outputted from the plurality of chips in parallel to the test design circuit in response to a plurality of output enable signals and the test design circuit serially transmits the plurality of output signals sequentially serving as the test data to the input output pad in response to a clock signal in the driving signals.

13. The chip testing system according to claim 12, wherein the signal interface further comprises:

a plurality of driving pads, coupled to the buffer circuit, wherein the plurality of driving pads receive the plurality of driving signals from the test equipment and transmit the plurality of driving signals to each of the chips via the buffer circuit; and an input output pad, coupled to the test design circuit and the buffer circuit, wherein the input output pad receives the input signal from the test equipment and transmits the input signal to each of the chips via the buffer circuit.

14. The chip testing system according to claim 13, wherein the buffer circuit comprises:

a plurality of driving buffers, wherein an input terminal of each of the driving buffers is coupled to a corresponding driving pad and an output terminal of each of the driving buffers is coupled to a driving pin on a corresponding chip;

a first input buffer, wherein an input terminal of the first input buffer is coupled to the input output pad, a plurality of second input buffers, wherein an input terminal of each of the second input buffers is coupled to an output terminal of the first input buffer and an output terminal of each of the second input buffers is coupled to an input output pin on a corresponding chip; and a plurality of output buffers, wherein an input terminal of each of the output buffers is coupled to the input output pin on the corresponding chip, a control terminal of each of the output buffers is coupled to a corresponding output enable signal, and an output terminal of each of the output buffers is coupled to the test design circuit.

15. The chip testing system according to claim 13, wherein the test design circuit comprises:

a plurality of flip-flop circuits connected in series, wherein a first input terminal of each of the flip-flop circuits is coupled to the buffer circuit, a second input terminal of a first level flip-flop circuit is coupled to a serial control signal, and second input terminals of the flip-flop circuits other than the flip-flop circuit at the first level is coupled to an output terminal of the flip-flop circuit at a previous level; and a test buffer, wherein an input terminal of the test buffer is coupled to an output terminal of a final level flip-flop circuit, a control terminal of the test buffer is coupled to a corresponding output enable signal, and an output terminal of the test buffer is coupled to the input output pad, wherein the flip-flop circuit at each of the levels transmits received output signals to the flip-flop circuit at a next level in response to the clock signal, so as to enable the final level flip-flop circuit to serially transmit the plurality of output signals sequentially serving at the test data through the test buffer.

16. The chip testing system according to claim 15, wherein each of the flip-flop circuits comprises:
a AND gate, wherein a first input terminal of the AND gate is coupled to the buffer circuit; and
a flip-flop, wherein an input terminal of the flip-flop is coupled to an output terminal of the AND gate, a control terminal of the flip-flop is coupled to the clock signal, and an output terminal of the flip-flop is coupled to a second input terminal of the AND gate in the next level the flip-flop circuit, wherein a second input terminal of the AND gate in the first level flip-flop circuit is coupled to the serial control signal and an output terminal of the flip-flop in the final level flip-flop circuit is coupled to an input terminal of the test buffer.

17. The chip testing system according to claim 13, wherein the signal interface further comprises:
an operating voltage pad, coupled to the buffer circuit, wherein the operating voltage pad receives an operating voltage and transmits the operating voltage to each of the chips via the buffer circuit.

18. The chip testing system according to claim 12, wherein the chip testing apparatus is disposed on a cutting lane on a wafer to which the chip cluster belongs.

19. The chip testing system according to claim 12, wherein the chip testing apparatus is disposed within the chip cluster.

* * * * *